United States Patent
Jansman et al.

(10) Patent No.: US 8,487,719 B2
(45) Date of Patent: Jul. 16, 2013

(54) BULK ACOUSTIC WAVE RESONATOR

(75) Inventors: Andreras B. M. Jansman, Nuenen (NL); Rensinus C. Strijbos, Nijmegen (NL); Erik Spaan, Elst (NL); Jan-Willem Lobeek, Nijmegen (NL)

(73) Assignee: TriQuint Semiconductor, Inc., Hillsboro, OR (US)

( * ) Notice: Subject to any disclaimer, the term of this patent is extended or adjusted under 35 U.S.C. 154(b) by 223 days.

(21) Appl. No.: 12/989,488

(22) PCT Filed: Apr. 24, 2009

(86) PCT No.: PCT/IB2009/051697
§ 371 (c)(1),
(2), (4) Date: Oct. 25, 2010

(87) PCT Pub. No.: WO2009/133511
PCT Pub. Date: Nov. 5, 2009

(65) Prior Publication Data
US 2011/0037539 A1    Feb. 17, 2011

(30) Foreign Application Priority Data
Apr. 29, 2008 (EP) .................................... 08103774

(51) Int. Cl.
*H03H 9/15* (2006.01)
*H03H 9/54* (2006.01)
*H03H 3/02* (2006.01)

(52) U.S. Cl.
USPC ............ 333/187; 333/189; 29/25.35; 29/594; 310/312

(58) Field of Classification Search
USPC ................ 333/187–189; 310/312; 29/25.35, 29/594
See application file for complete search history.

(56) References Cited

U.S. PATENT DOCUMENTS

| | | | |
|---|---|---|---|
| 4,870,313 A | 9/1989 | Hirama et al. | 310/320 |
| 6,812,619 B1 | 11/2004 | Kaitila et al. | 310/320 |
| 6,992,420 B2 | 1/2006 | Jang et al. | 310/324 |

(Continued)

FOREIGN PATENT DOCUMENTS

| | | |
|---|---|---|
| CN | 1286527 | 3/2001 |
| CN | 1364339 | 8/2002 |

(Continued)

OTHER PUBLICATIONS

Lobeek, Jan Willem; High-Q BAW Resonator on Pt/Ta2O5/SiO2 Based Reflector Stack; IEEE/MTT-S International Microwave Symp. Jun. 2007 pp. 2047-2050.
Kaitila, J., et al; "Spurious Resonance Free Bulk Acoustic WAFE Resonators"; Proceedings IEEE Ultrsonics Symposium; Honolulu, HI; vol. 1; pp. 84-87; (Oct. 2003).

(Continued)

*Primary Examiner* — Barbara Summons
(74) *Attorney, Agent, or Firm* — Schwabe, Williamson & Wyatt, P.C.

(57) ABSTRACT

A resonator comprises a bottom electrode layer (12), a top electrode layer (10) which defines a resonator body; and a piezoelectric layer (14) sandwiched between the top and bottom electrode layers. An external region (152) is provided around the outside of the periphery of the resonator body. The cutoff frequency of a first resonance mode of the external region (152) is matched to the cutoff frequency of a second, different, resonance mode of the resonator body. The invention provides a deliberate change (typically increase) in the cutoff frequency the resonance modes in the external region, so that one of the modes has a cutoff frequency close to the cutoff frequency of the fundamental mode of the resonator body.

15 Claims, 9 Drawing Sheets

U.S. PATENT DOCUMENTS

| | | | |
|---|---|---|---|
| 7,466,213 B2 * | 12/2008 | Lobl et al. | 333/187 |
| 7,816,998 B2 * | 10/2010 | Hara et al. | 333/187 |
| 2006/0119453 A1 * | 6/2006 | Fattinger et al. | 333/189 |
| 2008/0051039 A1 * | 2/2008 | Iwasaki et al. | 455/73 |
| 2008/0143215 A1 * | 6/2008 | Hara et al. | 310/328 |

FOREIGN PATENT DOCUMENTS

| | | |
|---|---|---|
| CN | 1450719 | 10/2003 |
| CN | 1592098 | 3/2005 |
| CN | 1864326 | 11/2006 |
| GB | 2418791 A | 4/2006 |
| WO | 01/06646 A | 1/2001 |
| WO | 01/06647 A1 | 1/2001 |
| WO | 2005034345 A1 | 4/2005 |
| WO | 2007036897 | 4/2007 |

OTHER PUBLICATIONS

Fattinger, G. G., et al; Optimization of Acoustic Dispersion for High Performance Think Film BAW Resonators; Ultrasonics Symposium vol. 2; 2005 IEEE; Rotterdam, NL; pp. 1175-1178 (Sep. 18, 2005).

Thalhammer, R., et al; "Spurious Mode Suppression in BAW Resonators"; Ultrasonics Symposium, 2006; IEEE, Piscatawy, NJ, US; pp. 456-459; (Oct. 1, 2006).

International Search Report for Application PCT/IB2009/051697 (Apr. 24, 2009).

Office Action, issued in Chinese Patent Application No. 200980115199.X, mailed Mar. 4, 2013, 5 pages.

* cited by examiner

BULK ACOUSTIC WAVE RESONATOR

This invention relates to bulk acoustic wave resonators.

A BAW resonator is essentially an acoustic cavity comprising a piezoelectric layer sandwiched between metal electrode layers. When an alternating electric signal is applied across these electrodes, the energy is converted to mechanical form and a standing acoustic wave is excited. The principle mode of vibration in practical thin-film resonators is the fundamental thickness-extensional (TE1) acoustic mode, i.e. vibration is normal to the layers at a frequency for which half a wavelength of this mode is approximately equal to the total thickness of the cavity.

In a film bulk acoustic wave resonator (or FBAR), a thin membrane forms the cavity of thickness of about one micrometer. In a solidly-mounted BAW resonator (or SBAR), a set of acoustically mismatched layers is used, which act to reflect the acoustic wave. This concept is analogous to the Bragg reflector in optics. The reflector layers are deposited on a solid substrate, typically glass or silicon (Si), so this structure is physically more robust than the FBAR.

For mobile communication applications with high demands on RF filter selectivity, thin-film Bulk Acoustic Wave (BAW) filters are becoming more and more the technology of choice. In order to get high-performance BAW filters, their building blocks, BAW resonators, need to have high quality factors and a minimal ripple on the electrical characteristics. The former is achieved by trapping the acoustic energy in the resonator. Unfortunately, energy trapping often leads to the occurrence of acoustic standing waves, resulting in unwanted peaks in the impedance curve of a BAW resonator.

Typically, BAW filters are employed if a communication standard requires high frequency selectivity. For example, this is the case in the US-PCS standard, in which the receive and transmit band are separated only by 20 MHz and strong suppression of the transmit signal is necessary in order to prevent crosstalk to the receive band. In order to achieve this performance, the resonators, constituting the BAW filter, need to have quality factors well above 1000 and need to be virtually free of spurious peaks. The total amplitude of spurious peaks can conveniently be represented in a non-circularity number (NC). For good filters, the resonators should have NC well below 1.

State-of-the-art, large BAW resonators do achieve these requirements. For small area resonators, however, these requirements are not met so easily. A reliable method to achieve low NC, even for small resonators, would ease design considerably.

In an ideal technology, the BAW resonator itself (the internal region) would be vibrating uniformly, and the surrounding world (the external region) would be completely in rest. Since both regions are connected, this is not possible.

Recently, a method has been developed to come close to this ideal situation. The outer edge of the resonator is equipped with a so-called guard ring or frame region.

The operation principle of the frame region will now be explained briefly. In approximation, the dependence of the vertical particle displacement $u_3$ on horizontal position $x_1$ and vertical position $x_3$ can be expressed as:

$$u_3(x_1,x_3)=u_{3,0}(x_3)\exp(j(\omega t-k_1 x_1)), \quad (1)$$

where $k_1$ is the complex wave number in the horizontal direction and $\omega$ is the radial frequency. A given layerstack only supports a discrete set of modes of this form at a given frequency. Often, the wave numbers of these modes are plotted versus frequency. This results in the so-called dispersion curves (an example is shown in FIG. 3).

Some modes have real wave numbers. They are propagating waves, which carry energy away. Other modes have imaginary wave numbers for some frequencies. At those frequencies there is particle vibration, but there is no horizontal energy flux. These modes are called evanescent modes.

It is desirable to have such an evanescent wave in the external region. It can provide a smooth transition from the uniformly vibrating internal region to the silent surroundings at some distance from the resonator. This ideal situation is sketched in FIG. 1.

FIG. 1 is a schematic representation of the particle displacement in a BAW resonator. The vertical particle displacement is uniform in the internal region, while the displacement decays as $e^{-k_1 x}$ in the external region. The top and bottom electrodes are shown as 10,12, and the piezoelectric layer is shown as 14.

Unfortunately, the arrangement of FIG. 1 does not obey the boundary conditions between the internal and external regions: the displacement $u_3(x_1)$ as well as its slope, $\partial u_3 \partial x_1$, should be continuous, but in the figure the slope is not continuous, as represented by the discontinuous envelope line. This is where the frame region helps, as shown in FIG. 2.

The frame region 16 comprises a region of additional thickness around the edge of the resonator. This provides additional mass per unit area. FIG. 2 is a schematic representation of the particle displacement in a BAW resonator with the frame region. The sinusoidal $u_3(x_1)$ dependence forms a continuous transition between internal and external region.

The mode in the frame region has a real wave number: it is propagating. Two such waves, propagating in opposite lateral directions, result in a standing wave with a sinusoidal dependence of the amplitude on position. This means that $u_3$ depends sinusoidally on the position $x_1$. This sine function links the uniform motion in the internal region (this is $k_1=0$ in formula (1)) to the decaying motion in the external region (imaginary $k_1$) in a smooth way.

FIG. 3 shows the dispersion curves for the internal region, external region and frame (guard ring) region. Real (imaginary) wave numbers are plotted on the right (left) of the vertical axis. At the resonant frequency, $f_{res}$, the external region has an imaginary wave number, the frame region has a real wave number and the internal region has $k=0$.

The resulting electrical performance is shown in FIG. 4 which shows the Impedance measurement plotted in a Smith chart. Line 40 represents the performance without a frame region. Line 42 is the case with a frame region. The ripple in the lower half of the figure has a different origin and is not discussed here.

The graph shows that the ripple above the resonance frequency has been reduced dramatically. Furthermore, line curve 42 is closer to the edge of the Smith chart, especially at antiresonance (right side of the figure), indicating higher quality factor.

In summary, the combination of uniform motion in the internal region, a real wave number in the frame region and an evanescent wave number in the external region results in high quality factor and low amount of spurious ripple.

It should be mentioned that the condition on the k-values is not enough for proper frame region operation. Also the dependence of the particle displacement (the vertical displacement $u_{3,0}$ but also the horizontal displacement $u_{1,0}$) on the vertical position $x_3$ (the so-called modeshape) should be similar in all three regions.

The requirements for the frame region method above have been explained to be $k_1=0$ in the internal region, $k_1$ is real in the frame region, and $k_1$ is imaginary in the external region. It is not difficult to fulfill the first two requirements: by depositing some material (the frame region), some weight is added and the dispersion curve can be arranged to go down in frequency and a real $k_1$ can be obtained. There is not a direct link between the amount of material or total weight and the cutoff frequency. However, given a particular layer stack, its cutoff frequency can be increased (lowered) by adding (or removing) material on top and in first approximation, the change in frequency is proportional to the mass density times the increase (or decrease) in thickness, i.e. the mass per unit area. Adding material to one of the deeper layers also generally results in a lowered cutoff frequency, but this is not exactly proportional to the added mass per unit area.

Likewise, obtaining an imaginary $k_1$ for the external region requires the amount of top layer weight to be somewhat less than in the internal region. This follows automatically: the top electrode does not extend into the external region. Unfortunately, the difference in amount of material is far too much. This can be seen in the sketch in FIG. 5, which shows dispersion curves for the internal region, external region and frame region in the ideal situation (left) and in a practical situation (right).

In the practical situation, at the resonance frequency of the internal region, the wave number in the external region is not an imaginary number at all anymore. This part of the problem can be summarized by stating that the difference in cutoff frequency (the frequency for which $k_1=0$) is too large for the external and internal regions. Furthermore, the external region is in a totally different domain in the dispersion space, so it can be expected that the modeshape is quite different from the modeshape in the internal region.

It may be contemplated to resolve this issue by making the difference in weight of the internal and external region less. There are then two options:
  make the top electrode thinner. This would help, but it is undesirable for other resonator properties. In particular the effective coupling constant $k^2$ would become significantly lower.
  add material to the external region. It is a possibility, but it should be non-conducting material, otherwise it would be an extension of the resonator area. The problem is that non-metals usually have much lower mass density than the metals of the electrodes (which are preferably medium-density metals like Mo, W, Pt). Adding dielectric to bring the dispersion curve down would require micrometers of dielectrics, which is practically unrealizable.

In summary, for a high-performance resonator, it is practically not possible to make an external region with a cutoff frequency that is slightly higher than the internal region cutoff frequency.

The invention relates generally to a resonator in which an evanescent wave can be generated in the external region, so that there is a smooth transition from the uniformly vibrating internal region to the silent surroundings at some distance from the resonator. This can improve the design of resonator whether or not a frame region is used.

According to the invention, there is provided a resonator comprising:
  a bottom electrode layer;
  a top electrode layer which defines a resonator body; and
  a piezoelectric layer sandwiched between the top and bottom electrode layers,
  wherein an external region is provided around the outside of the periphery of the resonator body,
  wherein the cutoff frequency of a first resonance mode of the external region is matched to the cutoff frequency of a second, different, resonance mode of the resonator body.

The invention provides a deliberate change (for example increase) in the cutoff frequency the resonance modes in the external region, so that one of the modes has a cutoff frequency close to the cutoff frequency of the fundamental mode of the resonator body. Preferably, the external region cutoff frequency is larger slightly than the antiresonance frequency of the resonator body. This enables an evanescent field to be generated in the external region outside the resonator body.

Preferably, the top electrode comprises a frame region of greater mass per surface area around the periphery of the resonator body and the inner region within the frame region. This means that the requirements for optimal frame region behaviour are met for the whole frequency range of interest (from resonance to antiresonance).

To achieve this shift in the external region resonance a reduction in mass density is required in the external region. The external region can have a lower number of layers than the inner region of the top electrode, and/or a lower thickness than the inner region of the top electrode, and/or it can comprise a layer with a higher weight or acoustic wave velocity than a layer at the same position within the stack as a layer in the inner region.

The inner region can have an area of 2500 $\mu m^2$ to 90000 $\mu m^2$, and the frame region can extend inwardly of the periphery by between 2 and 6 um. The external region can extend to a distance of 30 $\mu m$ or less.

The matching of cutoff frequency is preferably to within 10%.

The cutoff frequency of the first resonance mode is preferably slightly larger than the antiresonance frequency of the internal region.

The invention also provides a filter comprising a resonator of the invention. In the filter, the external region may not contain a top electrode nor bottom electrode along a significant part of the resonator edge.

The invention also provides a method of producing a resonator, comprising:
  forming a bottom electrode layer, a top electrode layer which defines a resonator body and a piezoelectric layer sandwiched between the top and bottom electrode layers;
  processing an external region around the outside of the periphery of the resonator body such that a cutoff frequency of a first resonance mode of the external region is matched to the cutoff frequency of a second, different, resonance mode of the resonator body.

The external region can be processed so that the cutoff frequency of a guided mode, different than the fundamental TE1 mode, but with a similar modeshape, is increased to be larger than the antiresonance frequency of the internal region. For example, processing the external region can comprise:
  thinning or removing the top piezoelectric layer from the external region; and/or
  removing the bottom electrode in the external region; and/or
  adapting a thickness of a lower layer in the external region between the bottom electrode and the piezoelectric layer (this layer could also be a reflector layer); and/or
  at least partially etching away a first layer in the external region and depositing a lighter material layer.

The invention will now be described with reference to the accompanying drawings, in which:
  FIG. 1 is used to explain particle displacement in a first known resonator design;

The invention provides a piezoelectric resonator an external region is provided around the outside of the periphery of a resonator body. The cutoff frequency of a first resonance mode of the external region is matched to the cutoff frequency of a second, different, resonance mode of the resonator body. The invention enables a high-performance resonator to be formed, with an external region with a cutoff frequency that is matched with (preferably slightly higher than) the resonator body cutoff frequency. This enables an evanescent wave to be formed in the external region and a real wave number propagating resonance in the resonator body.

As mentioned above, the invention can be applied to the design of resonators whether or not a frame region is used. However, an example which uses a frame region will be used to explain the invention.

Figure 6:
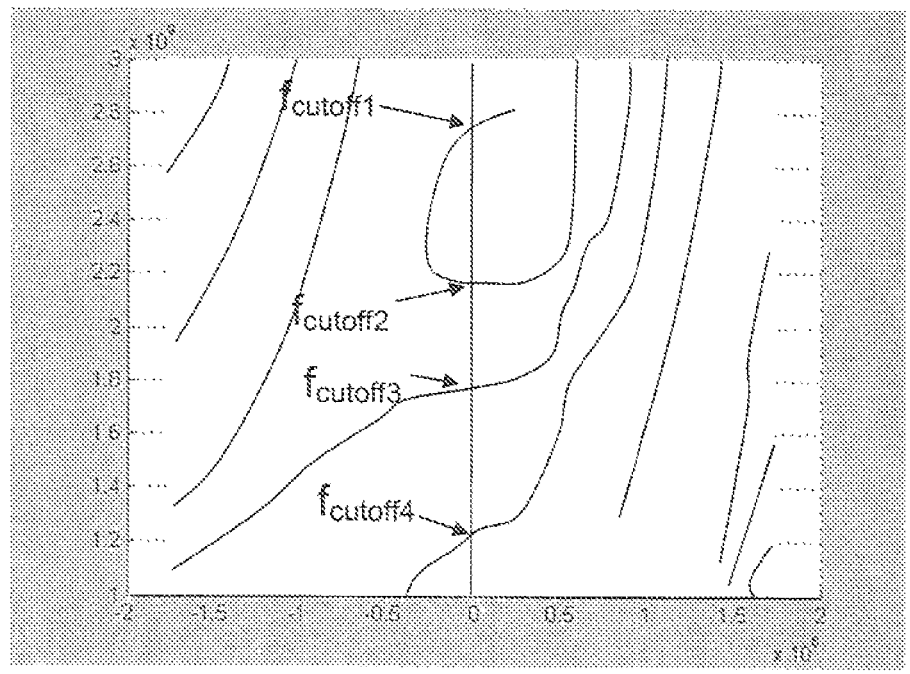
FIG. 6 shows the different resonance modes of the external part of the design of FIG. 3.

Simulations based on the invention are used to demonstrate the advantages of the invention. The simulation tools used allow for calculation of the dispersion curves for a given layerstack. Dispersion curves for the external region of an example technology are shown in FIG. 6 which shows dispersion curves for the external region for a practical situation.

In this simulation, the external region is identical to the internal region, except for the top electrode that is etched away. The cutoff frequency of the internal region was designed to be 1.88 GHz. The figure shows that the associated cutoff frequency (indicated as $f_{cutoff\_1}$) is much higher at 2.8 GHz. This mode cannot therefore provide the evanescent wave necessary for the frame region (guard ring) method to work optimally.

Figure 10:
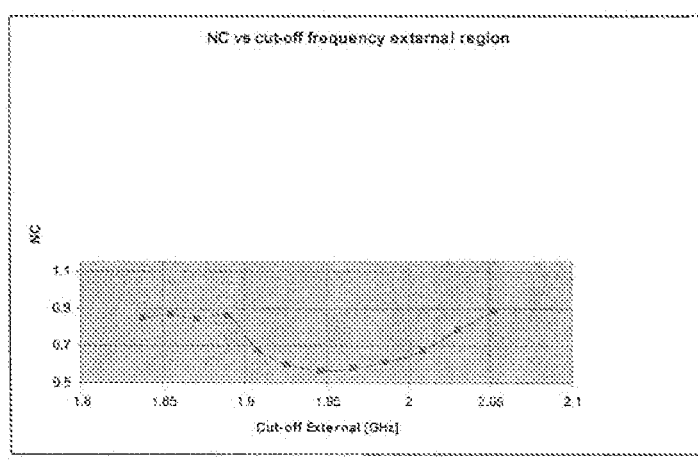
FIG. 10 shows how the resonance frequency of the external portion influences the resonator performance.

The figure also shows other modes. These other modes are generalized Lamb waves. At their cutoff frequency, they have a thickness-shear or thickness-extension character (TS1, TE1, TS2, etc.) For slightly different frequency the modes are coupled modes of thickness-shear and thickness-extension particle movement. As is seen in FIG. 10, some of them become evanescent at a much lower frequency.

The invention is based on the approach of increasing the cutoff frequency of a different mode in the external region so as to match the cutoff frequency of the internal region. In particular, one mode in the external region cutoff frequency is shifted to be larger slightly than the antiresonance frequency of the internal region. The requirements for optimal frame region behaviour are then met for the whole frequency range of interest (from resonance to antiresonance). Finally, the modeshapes in the external and frame regions should be similar.

With reference to FIG. 6, the invention is based on the idea of increasing the cutoff frequencies 3 and 4. This is achieved simply by removing material from the external region. One or more of the following actions may be implemented:

(i) thin the topmost layer (usually the piezoelectric layer) to a thickness such that the cutoff frequency has the desired value. If necessary remove it completely.

(ii) remove the bottom electrode in the external region.

(iii) adapt the thickness of a lower layer. For most layers, thinning increases the cutoff frequency. Some layers can be identified, for which thickness increase has this effect.

(iv) etch (or partially etch) away a heavy layer and deposit lighter material.

Removal of most of the layers will increase the cutoff frequency. However, the modeshape $u_{3,0}(x_3)$ and $u_{1,0}(x_3)$ for the external region should still resemble the modeshapes for the frame region.

It has been found that removal or thinning of the topmost layers proves to be most effective.

Figure 7:
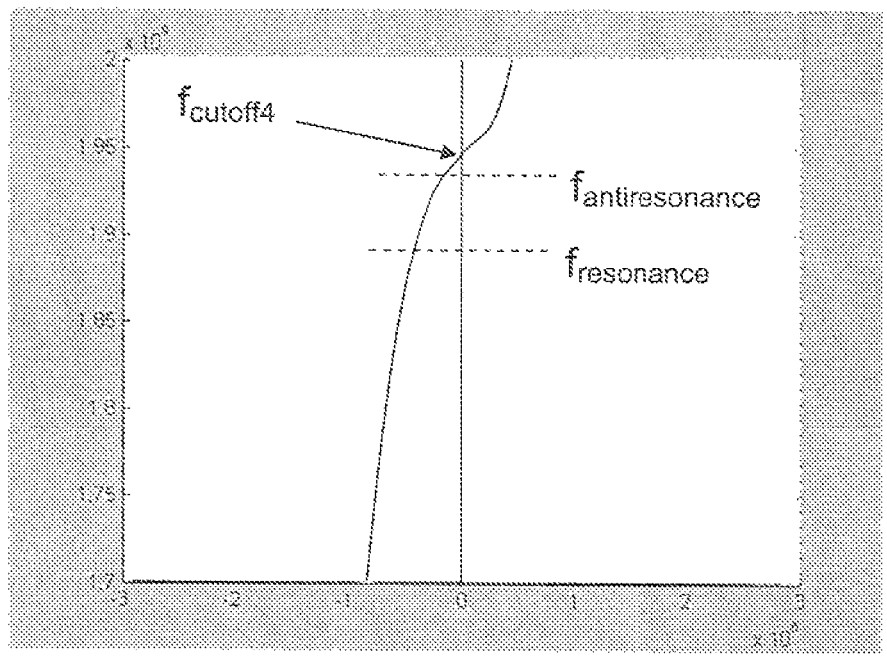
FIG. 7 shows the resonance of the external part of the design of FIG. 3 after shifting using the design method of the invention.

In FIG. 7, the dispersion curves are plotted for a case where the actions (i), (ii) and (iv) have been combined, so that there is a diminished layer thickness in the external region. The frequency $f_{cutoff\_4}$ has been brought just above the antiresonance frequency of the internal region.

Having the desired cutoff frequency is not enough for perfect conditions for the frame region method. Also the modeshape in the external region should resemble the modeshape in the frame region. These modeshapes can be calculated in a quasi-analytical model or in finite-element simulations.

In FIG. 8, the modeshapes of the horizontal and vertical displacements $u_{1,0}(x_3)$ and $u_{3,0}(x_3)$ are compared, as obtained from a quasi-analytical 2D model. There is good correspondence with the TE1 mode in the internal region.

Figure 8A:
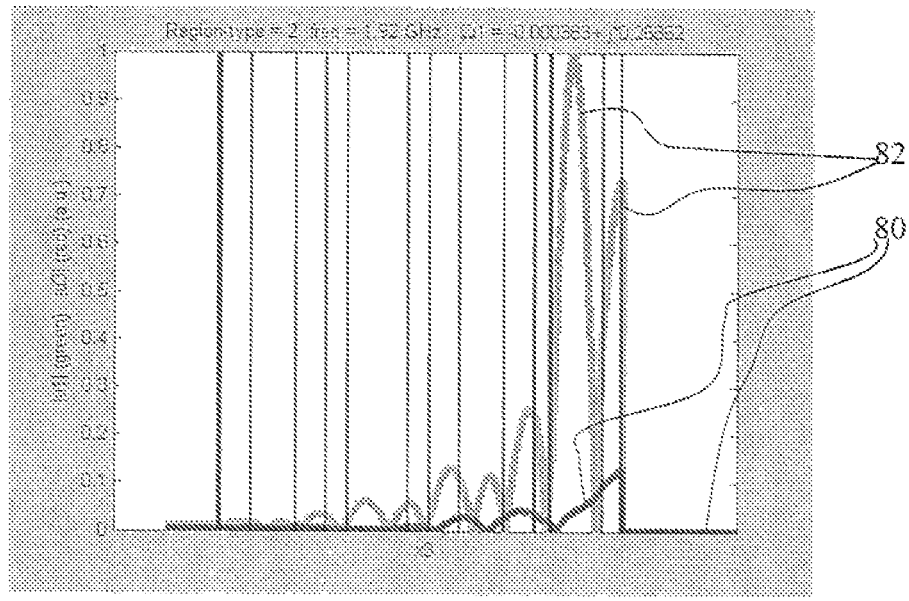
FIGS. 8A and 8B show the external region and frame region modeshapes for the design of FIG. 7.
Figure 8B:
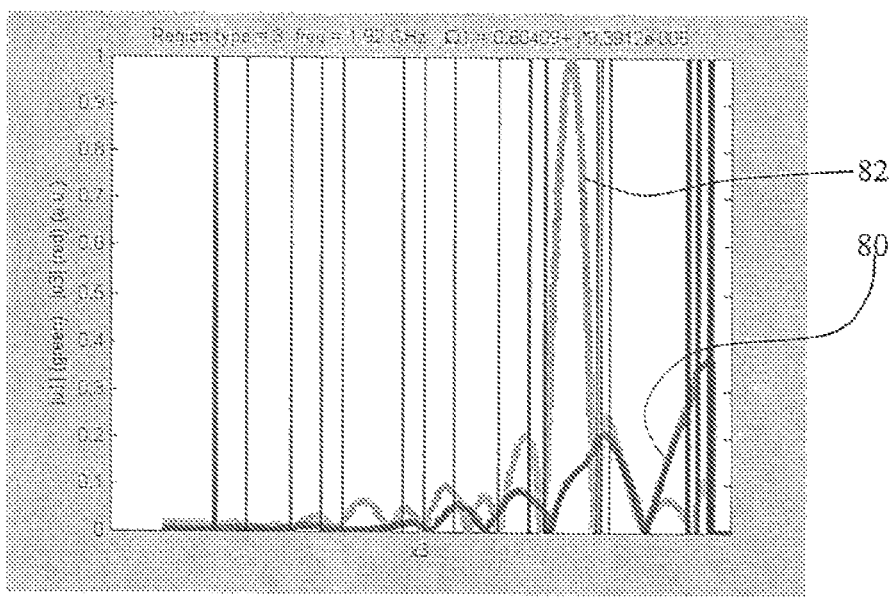

FIG. 8A shows the external region modeshape $u_3$ (plot 80) and $u_1$ (plot 82) as a function of the vertical position $x_3$ for the mode in FIG. 7. FIG. 8B shows the modeshape in the frame region. u3 and u1 plotted along the y-axis in FIGS. 8A and 8B are linear length units, normalised such that the maximum particle displacement is 1.

Figure 9:
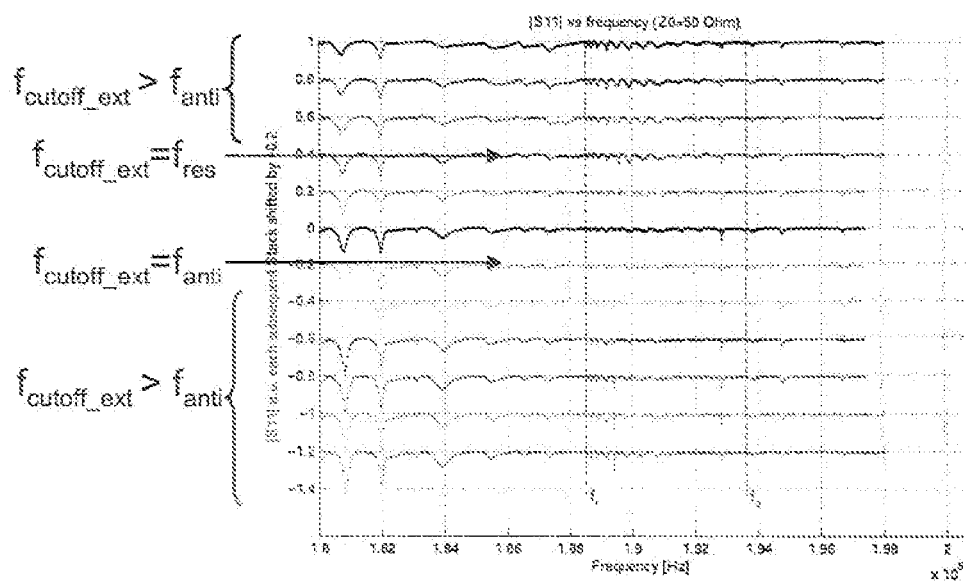
FIG. 9 shows how different frequency shifts give different performance.

In FIG. 9, simulation results are shown for varied frequencies fcutoff_4. The amplitude of the scatter parameter S11 is plotted as a function of frequency for varied cutoff frequency of the external region.

The part of FIG. 9 of interest is between the resonance frequency $f_r$ and the antiresonance frequency $f_a$.

The different plots in FIG. 9 are for different stack designs, which give different external cutoff frequencies.

Figure 1:
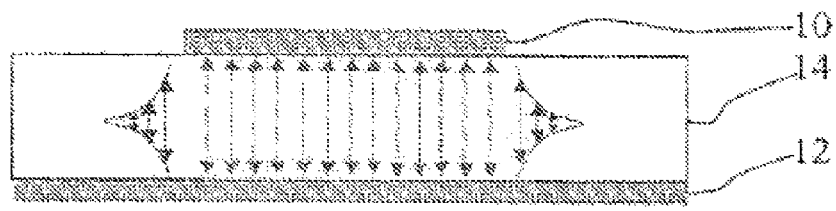
Figure 2:
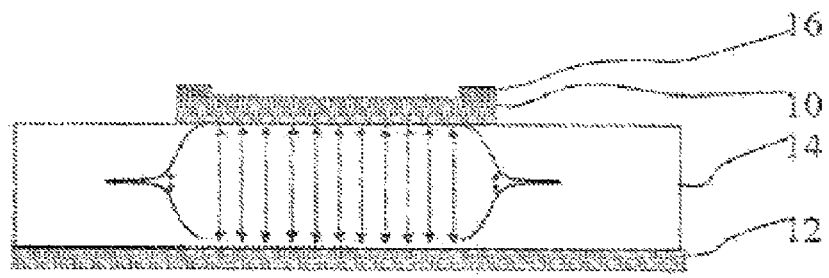
FIG. 2 is used to explain particle displacement in a second known resonator design.
Figure 3:
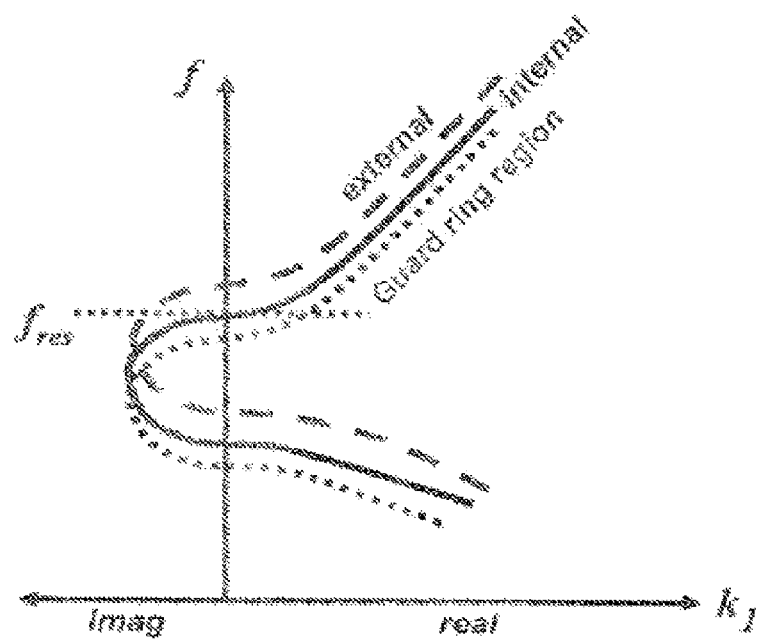
FIG. 3 shows an ideal resonance response of the different parts of the design of FIG. 2.
Figure 4:
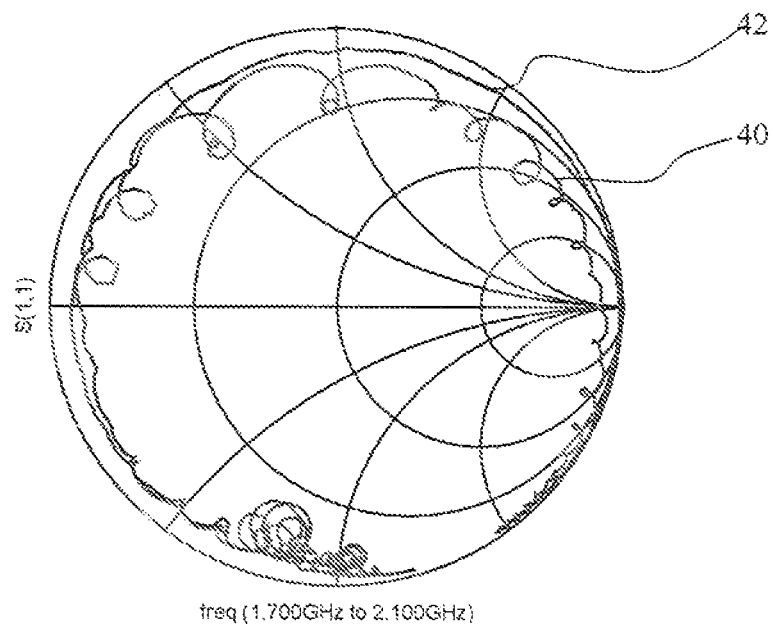
FIG. 4 is used to explain the electrical performance of the design of FIG. 3.
Figure 5:
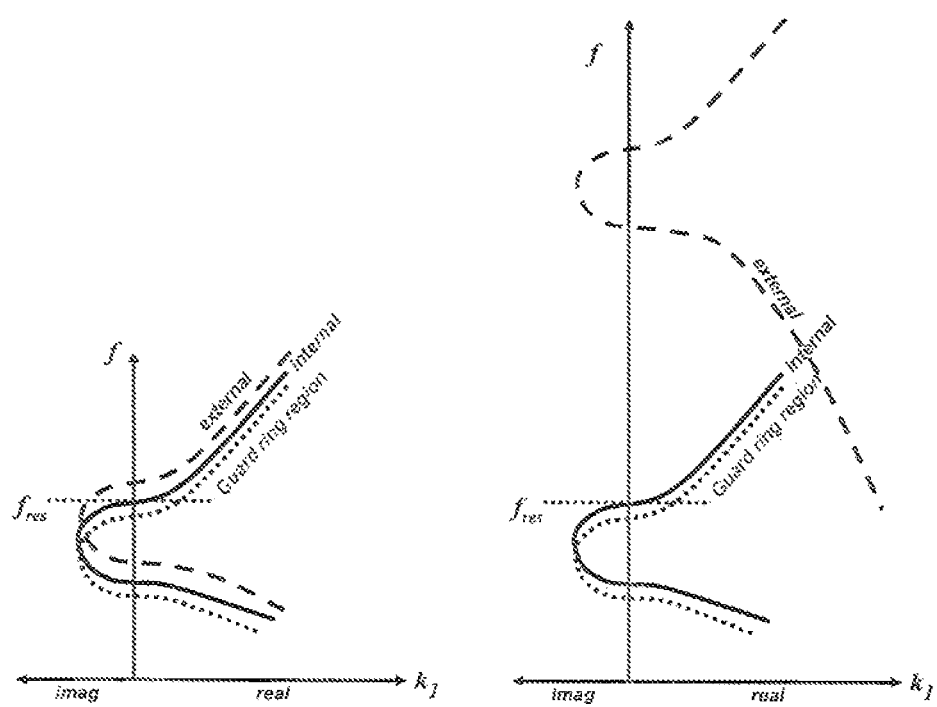
FIG. 5 shows the practical resonance response of the different parts of the design of FIG. 2.

The amplitude of the scatter parameter is shown (i.e. the distance from the center of the Smith chart as plotted in FIG. 4).

The spurs on the S11-curve are smallest if the cutoff frequency of the external region equals the antiresonance frequency of the internal region.

The non-circularity number (NC) is plotted in FIG. 10. The value clearly becomes better (lower) if the external cutoff frequency is above resonance (which is at 1.88 GHz in this example as seen in FIG. 9). This shows that matching into the evanescent wave in the external region has been achieved.

FIG. 10 shows that in this example, the effect of matching is lost if the cutoff frequency reaches 2.05 GHz. The optimum cutoff frequency is at 1.95 GHz. Thus, the cutoff frequency of the external region resonance mode is preferably matched to a value just above the antiresonance frequency of the resonator mass. Preferably, the cutoff frequency of the external region is within 10% and more preferably 5% of the resonance or antiresonance frequency (i.e. between frequency values 10% below the resonance frequency and 10% above the antiresonance frequency). More preferably, the cutoff frequency of the external region is within 10% of the cutoff frequency of the resonator mass (i.e. the resonant frequency, 1.88 GHz in this example), or within 5% of the antiresonance frequency.

Figure 11:
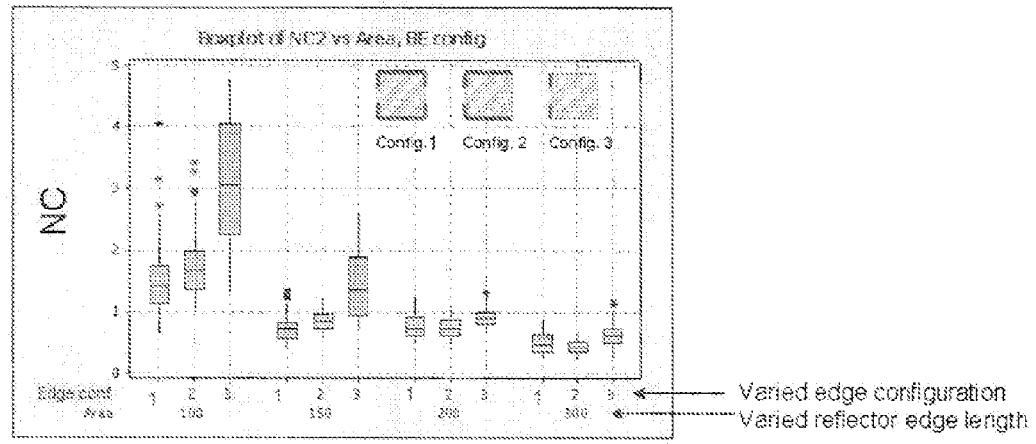
FIG. 11 is a first graph to demonstrate how the resonator performance varies for different amounts of processing of the external region.

In order to demonstrate the effect of the invention, modelling and comparison of different resonator designs has been carried out. Three different configurations are modelled: Edge configuration 1 has almost 80% of the resonator edge optimally terminated, Edge configuration 2 has 60% optimally terminated and Edge configuration 3 has 20% optimally terminated. "Optimally terminated" in this context means the external region has been processed to shift the cutoff frequency in the manner explained above. In FIG. 11, the NC of a resonator is plotted, for which part of the resonator edge connects to an optimised external region and the remaining fraction of the resonator edge connects to a conventional external region. The figure clearly shows that NC becomes better—so the spur amplitude becomes lower—when a larger fraction of the resonator edge is optimally terminated (i.e. moving from configuration 3 to 2 to 1.

Figure 12:
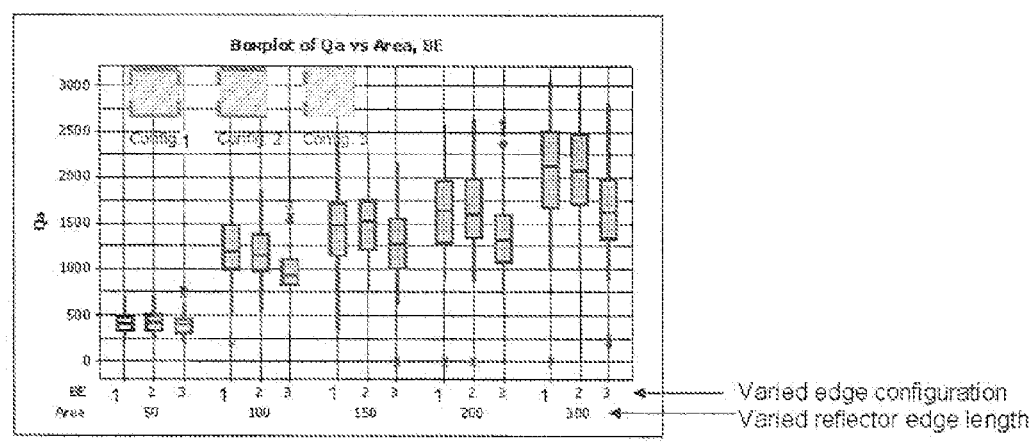
FIG. 12 is a second graph to demonstrate how the resonator performance varies for different amounts of processing of the external region.

Also the quality factor at antiresonance improves slightly when the fraction of optimal edge increases, as shown in FIG. 12, which relates to the same edge configurations.

Figure 13:
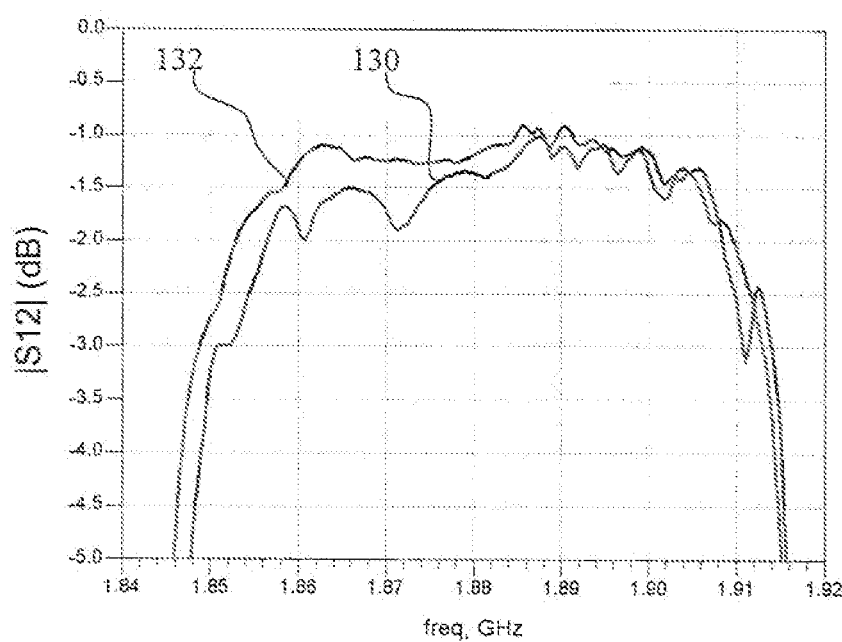
FIG. 13 shows how the invention can improve the characteristics of a resonator filter.

The external region trimming technique described above can be applied to BAW filters. In FIG. 13, the transmission parameter S12 is shown for two BAW filters: one with conventional technology (plot 130) and one in which the external regions around the resonators, constituting the BAW filter, have been optimised (plot 132).

Preferably, all of the resonator edge is connected to a trimmed external region. Typically, this requires both the top and the bottom electrode to be absent in the external region. Unfortunately, the resonator needs to be contacted with a top electrode and bottom electrode interconnect, so part of the resonator edge is non-optimal. However, this problem can also be resolved. At the locations where an interconnect contacts the resonator electrodes, some material of one of the other layers can be removed, so that also for this location the external region cutoff frequency is at the desired level, but interconnects can be maintained.

The internal region is the heart of the resonator, and is typically 2500 $\mu m^2$ to 90000 $\mu m^2$. The frame region is the outer rim of the resonator, which has some extra mass load, and has a typical width between 2 and 6 $\mu m$. There is overlap between the bottom and top electrodes in the internal region.

The external region is the near-surroundings of the resonator. This external region extends a distance which is some multiples of the decay distance $2\pi/Im(k_1)$. This means typically an external region width smaller than 25-30 $\mu m$. There is no overlap between the top and bottom electrodes in the external region. Outside this region, there are no design restrictions whatsoever.

In the arrangement of the invention, the external region and the resonator operate in different modes. The resonator mass is typically resonating in the fundamental thickness extension mode TE1 Other modes are the flexural extension mode F1, extensional mode E1, fundamental thickness shear mode TS1 and second harmonic thickness shear mode TS2. Note that for multilayer stacks, the modes are generally mixed products of these modes, rather than pure modes The external region may operate in the quasi-TS2 mode, if matching of the lateral particle movement is targeted. For matching of lateral and vertical particle motion one of the combined modes may be more convenient.

In the description above, the resonator has a modified external region and a frame region.

The invention can be applied to other types of resonator where matching into an evanescent mode in the external region is desired. An example is a laterally acoustic BAW filter, in which resonators are placed so close, that they mutually influence each other via an evanescent wave in the gap region.

Figure 14:
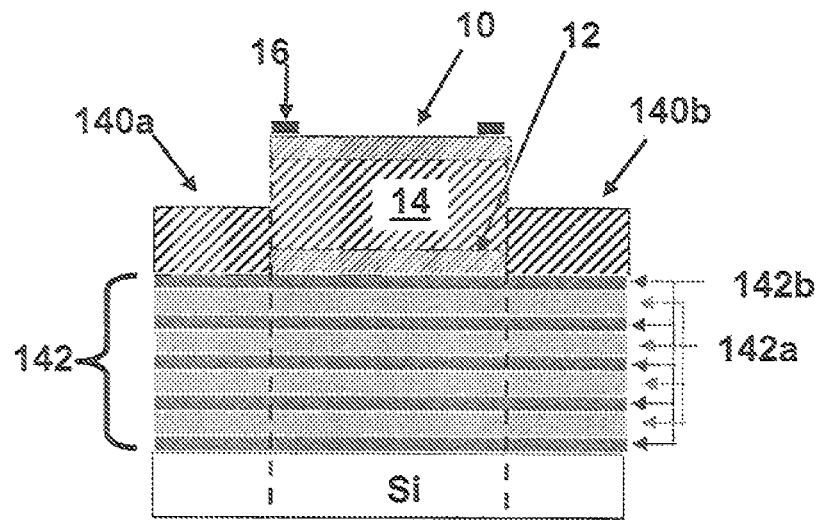
FIG. 14 shows an example of resonator of the invention in cross section, at two different locations.
Figure 14:
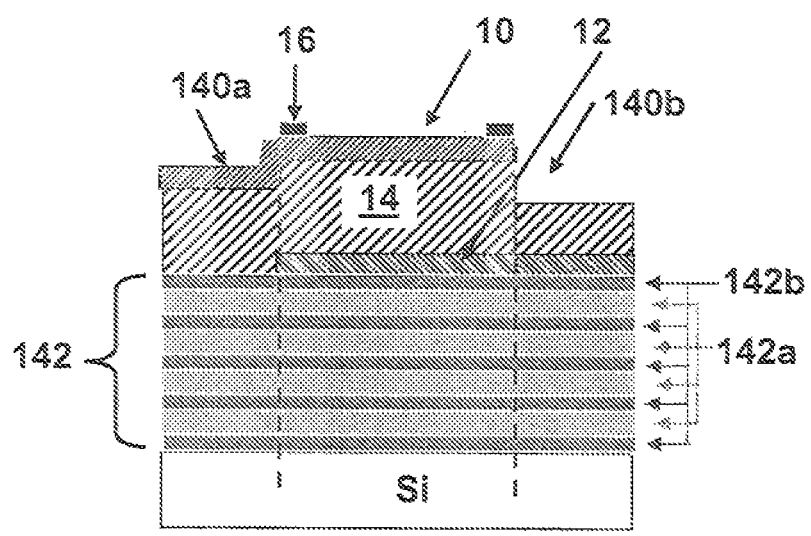

Electrical connections need to be made to the top and bottom electrodes. These form part of the edge of the resonator. These regions can be processed to provide the desired cutoff frequency, and this is explained with reference to FIG. 14.

The top figure shows the resonator in cross section away from the electrical connections. The figure shows the top electrode 10, bottom electrode 12, piezoelectric layer 14 and frame region 16. Outside the resonator area is the external region 140a and 140b. A Bragg reflector arrangement 142 is provided beneath the bottom electrode 12 and on top of the silicon substrate, formed of alternating layers 142a (for example WE, Pt or $Ta_2O_5$) and 142b (for example $SiO_2$ or $SiN_x$).

The bottom figure shows how the connections are made to the top and bottom electrodes. The top electrode 10 extends across into external region 140a. The bottom electrode 12 extends across into external region 140b. The figure shows that the piezoelectric layer has different thicknesses in these regions.

The widths of these regions can be kept as small as possible, while still providing low enough resistance. They should for example occupy less than half of the resonator edge, and more preferably less than one third.

The local processing of the layers in the external region is such that these external regions also provide the proper cutoff frequency. Of course, the thickness of layers other than the piezoelectric layer can be altered as well or instead.

Figure 15:
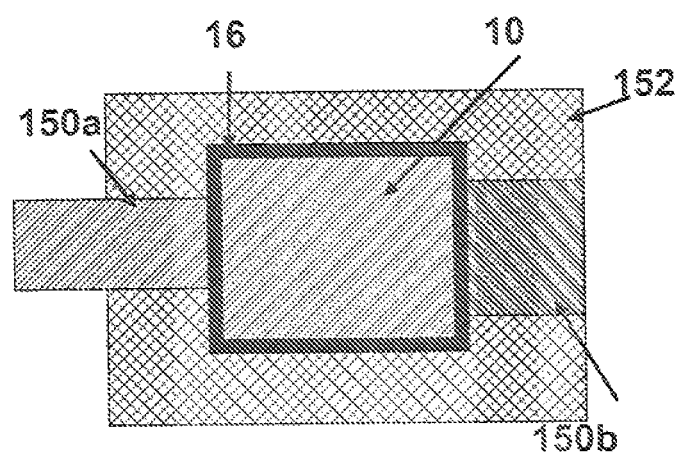
FIG. 15 shows the resonator of FIG. 14 in plan view.

FIG. 15 shows the resonator in plan view, and shows the top electrode connection 150a and the bottom electrode connection 150b. The external regions is the area 152 around the outside of the resonator.

A number of ways of processing the layers of the external region have been described briefly above but not shown in detail. However, there are many different ways to process or select the layers for the external region to achieve the desired frequency response, and these can be found with appropriate modelling. Thus, given the overall teaching provided by the invention as outlined above, many different examples of how to achieve the desired frequency shift will be apparent to those skilled in the art, and the implementation of the various approaches given above will also be routine.

Various modifications will be apparent to those skilled in the art.

The invention claimed is:
1. A resonator comprising:
   a bottom electrode layer;
   a top electrode layer which defines a resonator body, the top electrode layer comprising a top electrode comprising a frame region of greater mass per surface area around the periphery of the resonator body and an inner region within the frame region; and a piezoelectric layer sandwiched between the top and bottom electrode layers to form a stack;

wherein an external region is provided around the outside of the periphery of the resonator body, such that the cutoff frequency of a first resonance mode of the external region is matched to the cutoff frequency of a second, different, resonance mode of the resonator body.

2. A resonator as claimed in claim 1, wherein the external region has a lower number of layers than the resonator body region.

3. A resonator as claimed in claim 1, wherein the external region has a lower thickness than the resonator body region.

4. A resonator as claimed in claim 1, wherein the external region comprises a layer with a higher weight or acoustic wave velocity than a layer at the same position within the stack in the resonator body region.

5. A resonator as claimed in claim 1 wherein the resonator body has an area of 2500 $\mu m^2$ to 90000 $\mu m^2$.

6. A resonator as claimed in claim 1, wherein the frame region extends inwardly of the periphery by between about 2 and about 6 $\mu m$.

7. A resonator as claimed in claim 1, wherein the external region extends to a distance of 30 $\mu m$ or less.

8. A resonator as claimed in claim 1 wherein the matching is to within about 10%.

9. A resonator as claimed in claim 8, wherein the cutoff frequency of the first resonance mode is larger than the anti-resonance frequency of the resonator body.

10. A filter comprising a resonator as claimed in claim 1.

11. A filter as claimed in claim 10, wherein the external region does not contain top electrode nor bottom electrode along a significant part of the resonator body edge.

12. A filter as claimed in claim 10, comprising thinned or removed layers at the locations where a bottom or top electrode interconnect contacts the respective electrode.

13. A method of producing a resonator, comprising:
   forming a bottom electrode layer, a top electrode layer which defines a resonator body and a piezoelectric layer sandwiched between the top and bottom electrode layers;
   forming a frame region of greater mass per surface area around the periphery of the top electrode; and
   processing an external region around the outside of the periphery of the resonator body such that a cutoff frequency of a first resonance mode of the external region is matched to the cutoff frequency of a second, different, resonance mode of the resonator body.

14. A method as claimed in claim 13, wherein the external region is processed so that the cutoff frequency of the first resonance mode is increased to be larger than the anti-resonance frequency of the resonator body.

15. A method as claimed in claim 13, wherein processing the external region comprises:
   thinning or removing the top piezoelectric layer from the external region; and/or
   removing the bottom electrode in the external region; and/or
   adapting a thickness of a lower layer in the external region between the bottom electrode and the piezoelectric layer and/or
   at least partially etching away a first layer in the external region and depositing a lighter material layer.

* * * * *